United States Patent
Wasyluk et al.

(10) Patent No.: US 9,018,065 B2
(45) Date of Patent: Apr. 28, 2015

(54) HORIZONTAL EPITAXY FURNACE FOR CHANNEL SIGE FORMATION

(75) Inventors: Joanna Wasyluk, Dresden (DE); Yew Tuck Chow, Dresden (DE); Stephan Kronholz, Dresden (DE); Lindarti Purwaningsih, Dresden (DE); Ines Becker, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/466,234

(22) Filed: May 8, 2012

(65) Prior Publication Data

US 2013/0302973 A1 Nov. 14, 2013

(51) Int. Cl.

| | | |
|---|---|---|
| H01L 21/20 | (2006.01) | |
| H01L 21/205 | (2006.01) | |
| H01L 21/306 | (2006.01) | |
| H01L 21/8238 | (2006.01) | |
| H01L 21/8234 | (2006.01) | |
| C23C 16/458 | (2006.01) | |
| H01L 21/3065 | (2006.01) | |
| H01L 21/02 | (2006.01) | |
| H01L 21/67 | (2006.01) | |
| C23C 16/455 | (2006.01) | |

(52) U.S. Cl.
CPC *H01L 21/823807* (2013.01); *H01L 21/823412* (2013.01); *C23C 16/4587* (2013.01); *C23C 16/45578* (2013.01); *H01L 21/3065* (2013.01); *H01L 21/0262* (2013.01); *H01L 21/02532* (2013.01); *Y10S 414/136* (2013.01); *Y10S 414/139* (2013.01)

(58) Field of Classification Search
USPC ............................................ 438/504
See application file for complete search history.

(56) References Cited

U.S. PATENT DOCUMENTS

| | | | | |
|---|---|---|---|---|
| 4,613,305 | A | * | 9/1986 | Sakurai .................... 432/253 |
| 4,696,833 | A | * | 9/1987 | Monnig et al. ............... 438/778 |
| 5,783,495 | A | * | 7/1998 | Li et al. ..................... 438/738 |
| 7,402,473 | B2 | * | 7/2008 | Ishitsuka et al. .............. 438/197 |
| 8,574,981 | B2 | * | 11/2013 | Flachowsky et al. .......... 438/233 |
| 8,658,543 | B2 | * | 2/2014 | Wasyluk et al. .............. 438/734 |
| 8,703,551 | B2 | * | 4/2014 | Kronholz et al. ............. 438/154 |
| 2008/0079086 | A1 | * | 4/2008 | Jung et al. .................... 257/369 |
| 2008/0124814 | A1 | * | 5/2008 | Kumar et al. ................... 438/4 |
| 2008/0206942 | A1 | * | 8/2008 | Ting et al. .................... 438/218 |
| 2010/0078691 | A1 | * | 4/2010 | Mulfinger et al. ............ 257/288 |
| 2010/0109088 | A1 | * | 5/2010 | Ng et al. ..................... 257/369 |
| 2010/0229795 | A1 | * | 9/2010 | Tanabe et al. ................. 118/725 |
| 2010/0289094 | A1 | * | 11/2010 | Reichel et al. ................ 257/409 |
| 2011/0084367 | A1 | * | 4/2011 | Nishihata et al. ............. 257/632 |
| 2011/0318937 | A1 | | 12/2011 | Akae et al. |
| 2012/0058610 | A1 | * | 3/2012 | Ookoshi et al. ............... 438/230 |

* cited by examiner

*Primary Examiner* — Su C Kim
*Assistant Examiner* — Regan J Rundio
(74) *Attorney, Agent, or Firm* — Ditthavong & Steiner, P.C.

(57) ABSTRACT

A method and apparatus are provided for recessing a channel region of the PFET and epitaxially growing channel SiGe in the recessed region inside of a horizontally oriented processing furnace. Embodiments include forming an n-channel region and a p-channel region in a front side of a wafer and at least one additional wafer, the n-channel and p-channel regions corresponding to locations for forming an NFET and a PFET, respectively; placing the wafers inside a horizontally oriented furnace having a top surface and a bottom surface, with the wafers oriented vertically between the top and bottom surfaces; recessing the p-channel regions of the wafers inside the furnace; and epitaxially growing cSiGe without hole defects in the recessed p-channel regions inside the furnace.

10 Claims, 5 Drawing Sheets

HORIZONTAL EPITAXY FURNACE FOR CHANNEL SIGE FORMATION

TECHNICAL FIELD

The present disclosure relates to a method of fabricating semiconductor devices having reduced hole defects. The present disclosure is particularly applicable to semiconductor devices having chlorine gas ($Cl_2$) recessed channel silicon germanium (cSiGe), as in 32 nanometer (nm) technology nodes and beyond.

BACKGROUND

During wafer processing, the backside of the wafers is sometimes contaminated with metallic contamination by the wafer handling tools. The metallic contamination on the wafer backside is then driven deeper into the wafer during subsequent annealing or higher temperature processes. Further, during the $Cl_2$ recess cSiGe process for positive field-effect transistors (PFETs) in a standard vertical processing furnace, metallic contamination can be released from the wafer backside and deposited onto the front side of the wafer sitting below, which then can increase the etch rate of silicon (Si) and cause hole defects in the PFET during the epitaxy growth process. In addition, available standard cleaning (SC-1, SC-2) procedures, are ineffective in this context because the metallic contamination has already been driven into the silicon backside prior to the recess process.

A need therefore exists for methodology and apparatus enabling fabrication of semiconductor devices having $Cl_2$ recessed cSiGe with reduced hole defects.

SUMMARY

An aspect of the present disclosure is a method for recessing a channel region of a wafer and epitaxially growing SiGe in that region in a horizontally oriented processing furnace.

Another aspect of the present disclosure is a horizontally oriented processing furnace.

A further aspect of the present disclosure is an apparatus including three horizontally oriented furnaces stacked.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a p-channel region and an n-channel region in a front side of a wafer, the p-channel and n-channel regions corresponding to locations for forming a PFET and a negative field-effect transistor (NFET), respectively; placing the wafer inside a horizontally oriented furnace having a top surface and a bottom surface, with the wafer oriented vertically between the top and bottom surfaces; recessing the p-channel region of the wafer inside the furnace; and epitaxially growing cSiGe in the recessed p-channel region inside the furnace.

Aspects of the present disclosure include forming a p-channel region and an re-channel region in a front side of at least one additional wafer, the p-channel and n-channel regions corresponding to locations for forming a PFET and an NFET, respectively; placing each additional wafer inside the horizontally oriented furnace, with each additional wafer oriented vertically between the top and bottom surfaces, forming a horizontal stack of wafers between the top surface and the bottom surface inside the furnace, prior to recessing the p-channel region of the wafer; recessing the p-channel region of the additional wafers simultaneously with the wafer inside the furnace; and epitaxially growing cSiGe in the recessed p-channel region of each additional wafer simultaneously with the wafer inside the furnace. Another aspect includes forming a hardmask over the n-channel region of the wafer and each additional wafer prior to placing the wafer and the additional wafers inside the furnace. Other aspects include forming the hardmask by: forming a pad oxide layer on the wafer and on each additional wafer; thermally oxidizing the pad oxide layer; and removing a portion of the oxidized pad oxide from the p-channel region of the wafer and each additional wafer. Further aspects include pre-cleaning the first surface of the wafer and each additional wafer prior to placing the wafer and each additional wafer in the furnace. Additional aspects include recessing the p-channel region of the wafer and each additional wafer by reactive ion etching (RIE), for example to a depth of 90 angstroms (Å), e.g., with $Cl_2$. Further aspects include supplying the $Cl_2$ gas to the wafer and each additional wafer from the top surface along the length of the furnace. Another aspect includes epitaxially growing cSiGe by supplying reaction gases to the wafer and each additional wafer from the top surface of the furnace along the length of the furnace. Other aspects include removing unused $Cl_2$ and reaction gases from the bottom surface of the furnace at a location remote from the stack of wafers. Additional aspects include baking the wafer and each additional wafer in the horizontally oriented furnace after recessing the p-channel regions and prior to epitaxially growing the cSiGe.

Another aspect of the present disclosure is an apparatus including: a furnace including: a horizontally oriented chamber having a top inner surface and a bottom inner surface; a wafer holder extending in a horizontal direction, for holding a plurality of wafers stacked along the wafer holder, with each wafer being positioned vertically; a gas inlet in the top surface at one end of the chamber; and a gas exhaust in the bottom surface of the chamber at the one end. Other aspects of the present disclosure include the gas exhaust being separated in a horizontal direction from the stack of wafers. Further aspects include a gas tube from the gas inlet along the top inner surface and having openings along the length of the wafer holder. Additional aspects include the wafer holder holding up to 100 wafers for simultaneous processing. Another aspect includes contamination released during the recess process being disposed by the gas exhaust.

Another aspect of the present disclosure is an apparatus including: three horizontally oriented furnaces stacked vertically, each furnace comprising: a horizontally oriented chamber having a top inner surface and a bottom inner surface; a wafer holder holding a plurality of wafers stacked in a horizontal direction, with each wafer being positioned vertically; a gas inlet in the top surface at one end of the chamber; a gas exhaust in the bottom surface of the chamber at the one end; and a gas source for supplying gas to each of the gas inlets. Another aspect includes a common gas source for all three processing furnaces. Further aspects include each wafer holder holding up to 100 wafers for simultaneous processing.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1:
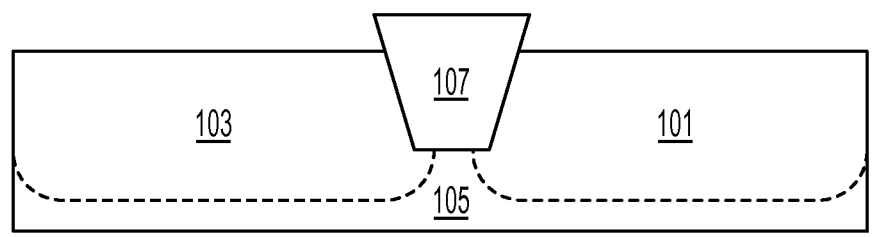
FIGS. 1 through 3, 4B, and 4C schematically illustrate a method and FIG. 4A schematically illustrates an apparatus in which method steps of FIGS. 4B and 4C are performed, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of hole defects attendant upon recessing Si wafers with $Cl_2$ gas and epitaxially growing cSiGe in the recesses of the Si wafers in a vertically oriented furnace. More specifically, in vertical furnaces metallic contamination located in the silicon backside of a wafer can be released and dropped onto the wafer sitting below during the recess process. In accordance with embodiments of the present disclosure, the wafers are oriented vertically in a horizontally disposed furnace. Metallic contamination dropping off of the backside of wafers falls to the bottom of the chamber rather than on adjacent wafers and is disposed through an exhaust remote from the wafers.

Methodology in accordance with embodiments of the present disclosure includes forming an n-channel region and a p-channel region in a front side of a wafer, the n-channel and p-channel regions corresponding to locations for forming an NFET and a PFET, respectively; placing the wafer inside a horizontally oriented furnace having a top surface and a bottom surface, with the wafer oriented vertically between the top and bottom surfaces; recessing the p-channel region of the wafer inside the furnace; and epitaxially growing cSiGe in the recessed p-channel region inside the furnace.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

A method in accordance with an exemplary embodiment of the present disclosure is schematically illustrated in FIGS. 1 through 3, 4B, and 4C. Adverting to FIG. 1, an n-channel region 101 and a p-channel region 103 are formed in a front side of a wafer 105 by pre-gate implantation, the n-channel and p-channel regions corresponding to locations for forming an NFET and a PFET, respectively. In addition, the n-channel region 101 and the p-channel region 103 are separated by a shallow trench isolation (STI) region 107. Further, an n-channel region 101 and a p-channel region 103 are formed in a front side of at least one additional wafer 105.

Figure 2:
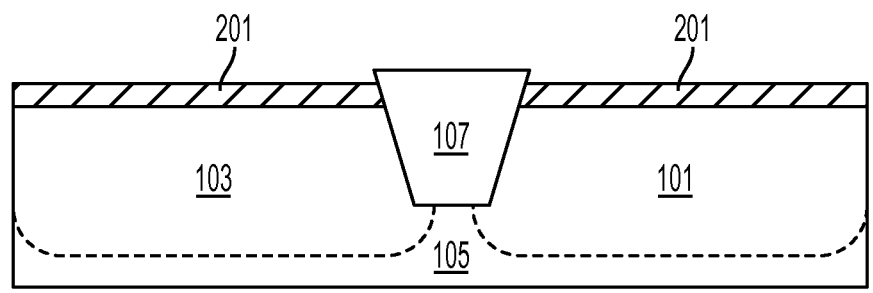

Adverting to FIG. 2, hard mask layer 201 is formed by thermal oxidation on the re-channel regions 101 and the p-channel regions 103 of each wafer 105. Further, a resist (not shown for illustrative purposes) is spun on over the n-channel regions 101 of the first surface of each wafer 105.

Figure 3:
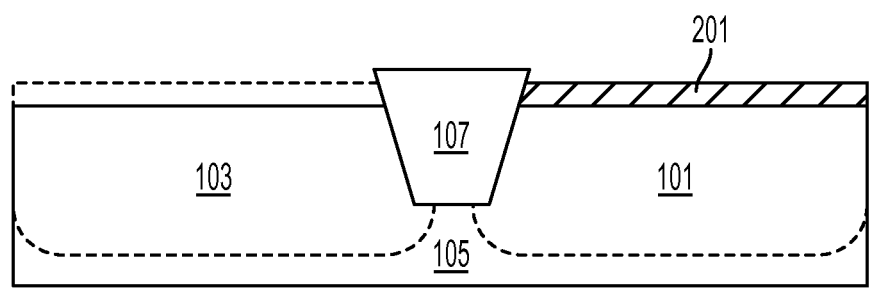

Adverting to FIG. 3, the hardmask 201 is selectively removed from the p-channel region 103 of each wafer 105, e.g., by etching, while the resists and oxide hardmasks 201 remain on the n-channel regions 101 of the front side of each wafer 105. The oxide hardmasks 201 covering the n-channel regions 101 will protect the n-channel regions 101 from recessing and growing cSiGe during subsequent processing. Then the resist is stripped off from the n-channel regions 101 of wafers 105, and the front side of each wafer 105 is pre-cleaned, e.g., using ammonia-peroxide (APM) and diluted hydrofluoric acid (dHF).

Figure 4A:
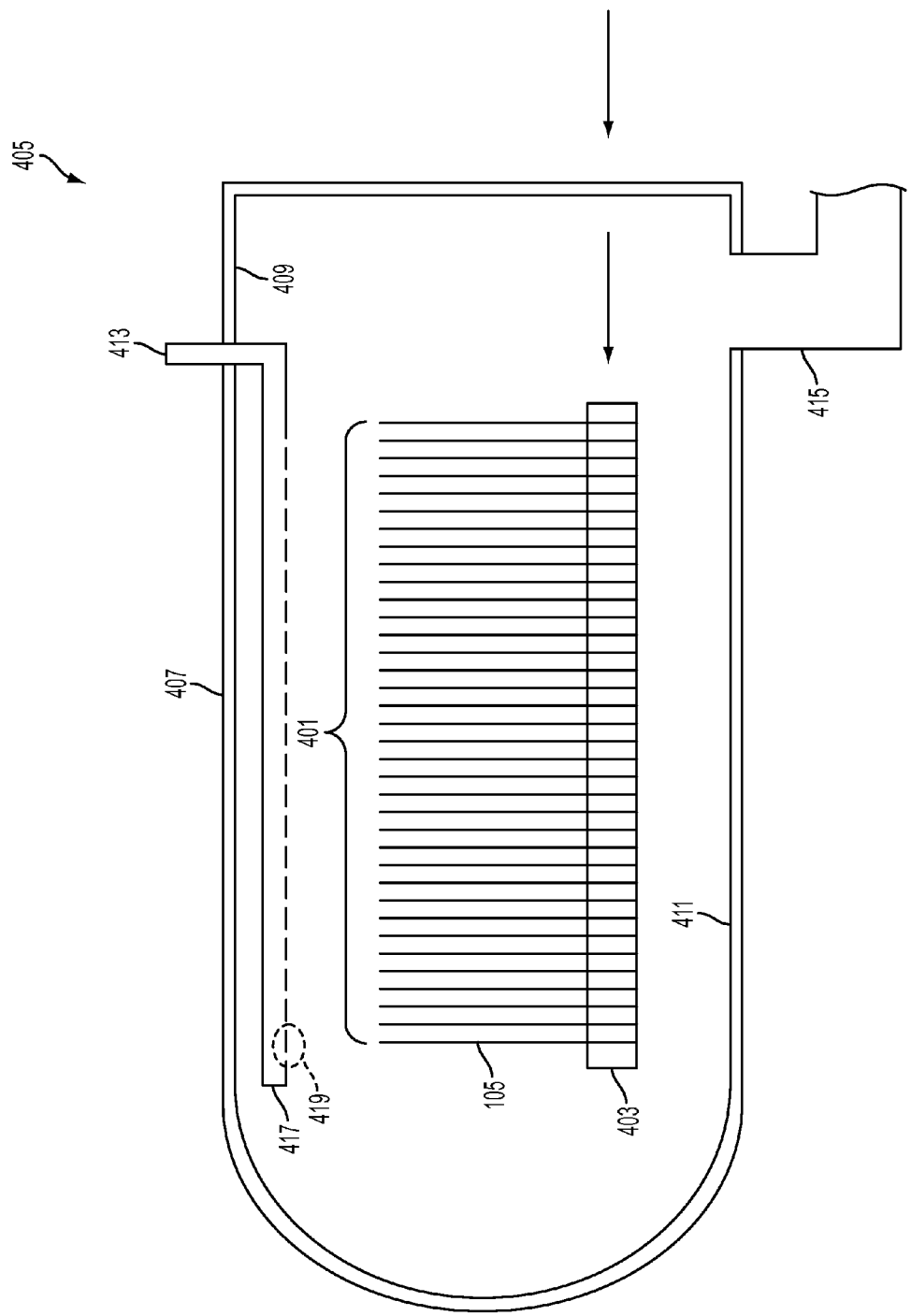

Adverting to the apparatus of FIG. 4A, the wafers 105 are then placed in a wafer holder 403, e.g., capable of holding up to 100 wafers for simultaneous processing. More specifically, a group 401 of up to 100 wafers 105 are stacked along the wafer holder 403, with each wafer being positioned vertically. The wafer holder 403 is then placed into a horizontally oriented furnace 405 including a chamber 407 having a top inner surface 409, a bottom inner surface 411, a gas inlet 413 in the top surface at one end of the chamber 407, a gas exhaust 415 in the bottom surface of the chamber 407 at the same end. Further, the chamber 407 includes a gas tube 417 attached to the gas inlet 413 near the top inner surface 409 of the chamber 407 and having openings 419 along the length of the wafer holder 403.

Figure 4B:
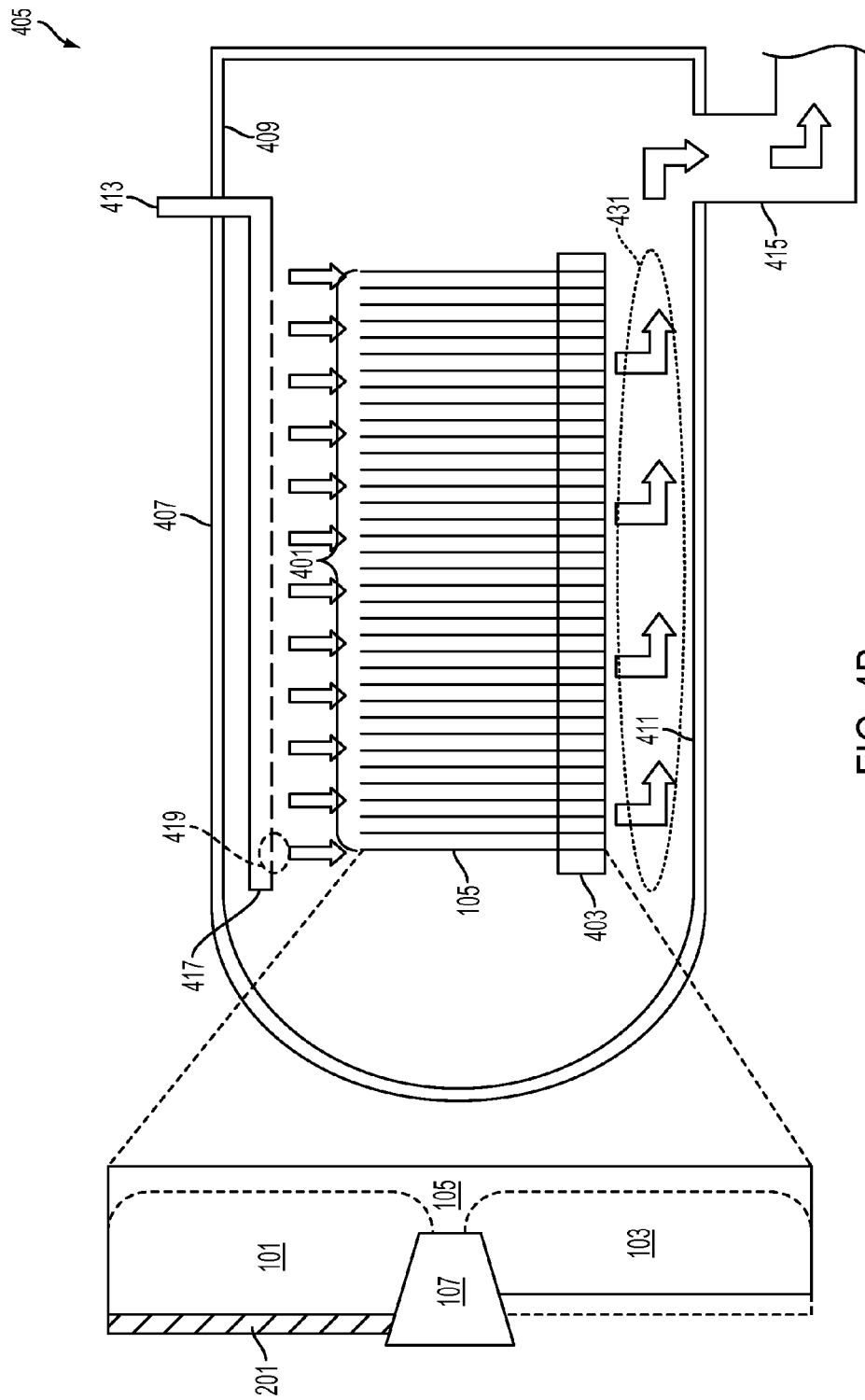

Adverting to FIG. 4B, after the wafers 105 in the wafer holder 403 have been placed in chamber 407, the p-channel region 103 of each wafer 105 is recessed inside of the chamber 407 by an RIE process according to a particular cSiGe epitaxial growth target. More specifically, the p-channel regions 103 of the wafers 105 are etched simultaneously to a depth of approximately 90 angstroms (Å) using $Cl_2$, e.g., a $Cl_2$ and hydrogen gas ($H_2$) mixture, which is supplied to the chamber 407 through the openings 419 in the gas tube 417, e.g., for 1 to 30 minutes, for example 5 minutes at 200 to 1000° C., for example 550° C. Moreover, the gas exhaust and resulting metallic contaminants 431 are separated in a horizontal direction from the stack of wafers and disposed through the gas exhaust 415. The wafer 105 and each additional wafer 401 are then baked in the chamber 407, e.g., in the presence of $H_2$ for 1 to 100 minutes, for example 30 minutes, at 500 to 1500° C., e.g., 800° C.

Figure 4C:
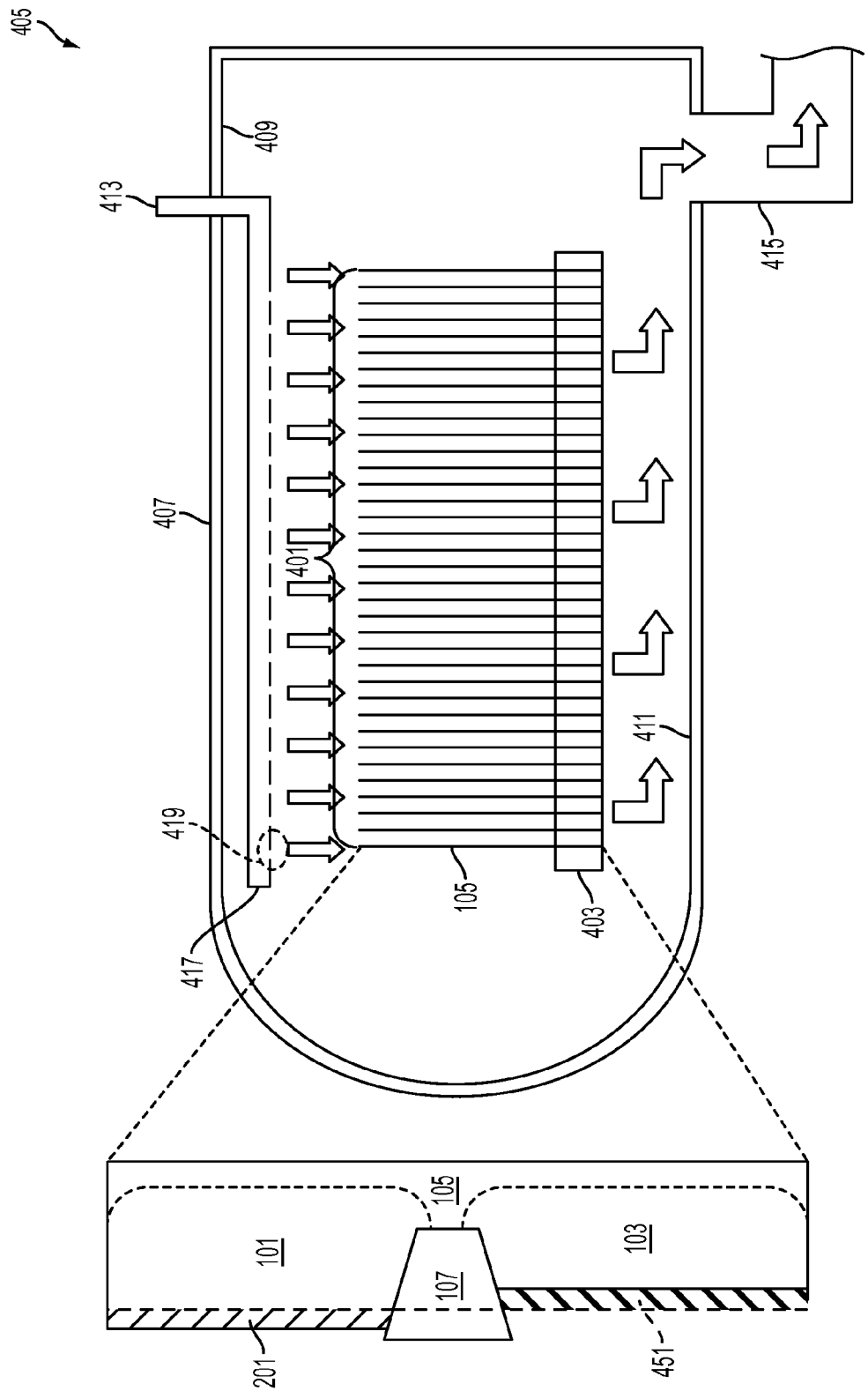

Adverting to FIG. 4C, after the baking process, a layer of cSiGe 451 is epitaxially grown in the recessed p-channel regions 103 of each wafer 105 inside of the chamber 407. More specifically, the layer of cSiGe 451 is epitaxially grown by supplying reaction gases, e.g., $H_2$, silane ($SiH_4$), and germane ($GeH_4$), to each wafer 105 from gas tube 417 of the chamber 407, e.g., for 1 to 60 minutes, such as 17 minutes, at 300 to 800° C., e.g., 465°. In addition, unused reaction gases are removed from the bottom surface of the chamber 407 by the gas exhaust 415. The top surface of the cSiGe in the PFET after deposition is on the same level as an active surface of the NFET (i.e., no N/P-active step height).

Figure 5:
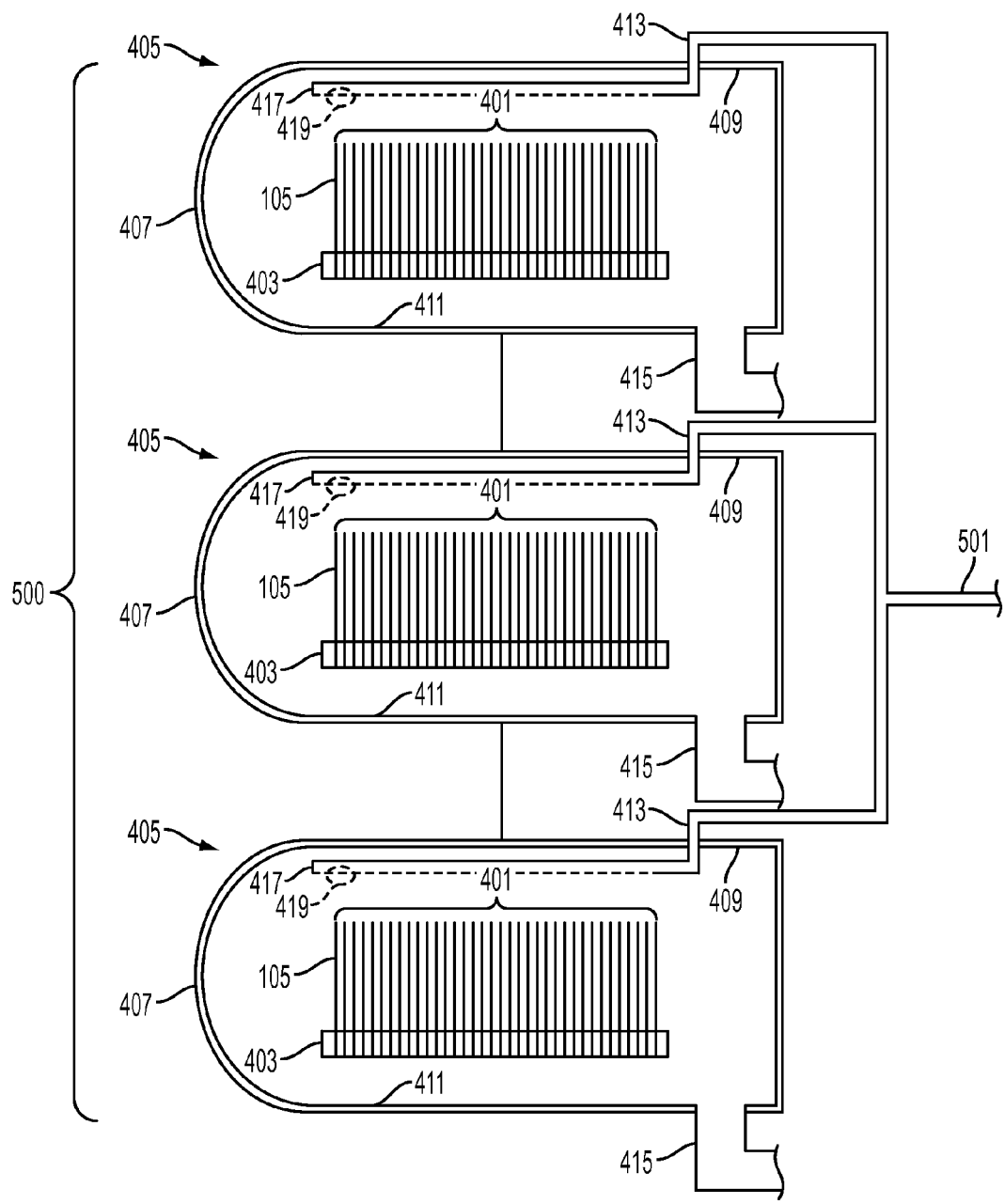
FIG. 5 schematically illustrates an apparatus, in accordance with an exemplary embodiment of the present disclosure.

An apparatus in accordance with an embodiment of the present disclosure is schematically illustrated in FIG. 5. Adverting to FIG. 5, three horizontally oriented furnaces 405 are stacked vertically to form the apparatus 500. Each furnace 405 includes a chamber 407 having a top inner surface 409 and a bottom inner surface 411; a wafer holder 403 capable of holding a group 401 of wafers, e.g., up to 100 wafers 105, stacked in a horizontal direction, with each wafer being positioned vertically; a gas inlet 413 in the top surface at one end of the chamber 407; a gas exhaust 415 in the bottom surface of the chamber 407 at the same end; and a common gas source 501 that is connected to the gas inlet 413 of all three processing furnaces 405.

The horizontally disclosed furnace illustrated in FIG. 4A and the apparatus of FIG. 5 have been disclosed as applying to the formation of cSiGe on semiconductor wafers. However, the device and apparatus would likewise be applicable to the formation of embedded silicon germanium (eSiGe), for example in the source/drain regions of semiconductor wafers.

The embodiments of the present disclosure can achieve several technical effects including reduction of hole defects produced by metallic contaminants dropping from one wafer to another during an RIE process, improved gas flow, thereby improving the uniformity of epitaxial growth of cSiGe on wafers, and maximized space by stacking three horizontal processing furnaces on top of one other. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices including cSiGe.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming an n-channel region and a p-channel region in a front side of a wafer, the n-channel and p-channel regions corresponding to locations for forming a negative field-effect transistor (NFET) and a positive field-effect transistor (PFET), respectively;
    placing the wafer in a wafer holder inside a horizontally oriented furnace having a top surface, a bottom surface, and a gas exhaust, with the wafer oriented vertically between the top and bottom surfaces, the wafer holder being spaced from the bottom surface;
    recessing the p-channel region of the wafer, by etching the p-channel to a depth of no more than 90 angstroms (Å), inside the furnace;
    removing any metallic contaminants produced by the recessing step via the gas exhaust;
    baking the wafer in the furnace after recessing the p-channel region; and
    epitaxially growing channel silicon germanium (cSiGe) in the recessed p-channel region inside the furnace after baking.

2. The method according to claim 1, comprising:
    forming an n-channel region and a p-channel region in a front side of at least one additional wafer, the n-channel and p-channel regions corresponding to locations for forming an NFET and a PFET, respectively;
    placing each additional wafer inside the horizontally oriented furnace, with each additional wafer oriented vertically between the top and bottom surfaces, in a horizontal stack of wafers between the top surface and the bottom surface inside the furnace, prior to recessing the p-channel region of the wafer;
    recessing the p-channel region of each additional wafer simultaneously with the wafer, inside the furnace;
    baking the additional wafers in the furnace simultaneously with baking the wafer; and
    epitaxially growing cSiGe in the recessed p-channel region of each additional wafer simultaneously with the wafer, inside the same furnace.

3. The method according to claim 2, comprising forming a hardmask over the n-channel area of the wafer and each additional wafer prior to placing the wafer and each additional wafer inside the furnace.

4. The method according to claim 3, comprising forming the hardmask by:
    thermally oxidizing the wafer and each additional wafer; and removing an oxidized portion from the p-channel region of the wafer and each additional wafer.

5. The method according to claim 4, further comprising pre-cleaning the first surface of the wafer and each additional wafer prior to placing the wafer and each additional wafer in the furnace.

6. The method according to claim 2, comprising recessing the p-channel region of the wafer and each additional wafer by reactive ion etching (RIE).

7. The method according to claim 6, comprising etching with chlorine gas ($Cl_2$).

8. The method according to claim 7, comprising supplying the $Cl_2$ gas to the wafer and each additional wafer from an area near the top surface along the length of the furnace.

9. The method according to claim 8, comprising epitaxially growing cSiGe by supplying reaction gases to the wafer and each additional wafer from an area near the top surface along the length of the furnace.

10. The method according to claim 9, comprising removing unused $Cl_2$ and reaction gases from the bottom surface of the furnace at a location remote from the stack of wafers.

* * * * *